United States Patent [19]

Nunnally et al.

[11] Patent Number: 5,220,302
[45] Date of Patent: Jun. 15, 1993

[54] NMR CLINICAL CHEMISTRY ANALYZER AND METHOD OF FORMING A SHIELD

[75] Inventors: Ray L. Nunnally, Dallas; Pietro P. Antich, Richardson, both of Tex.

[73] Assignee: The University of Texas System Board of Regents, Austin, Tex.

[21] Appl. No.: 467,909

[22] Filed: Jan. 22, 1990

[51] Int. Cl.$^5$ .............................................. H01F 7/00
[52] U.S. Cl. .................................. 335/301; 324/318; 324/322
[58] Field of Search ...................... 220/423; 62/51.3; 436/173; 324/318, 322, 307, 320; 336/84 M; 335/301, 214, 216

[56] References Cited

U.S. PATENT DOCUMENTS

| | | | |
|---|---|---|---|
| 3,149,742 | 9/1964 | Hay et al. | 220/423 |
| 3,626,345 | 12/1971 | Funaki | 336/84 M |
| 4,425,547 | 1/1984 | Sugimoto | 324/318 |
| 4,612,505 | 9/1986 | Zijlstra | 324/318 |
| 4,635,017 | 1/1987 | Ries | 324/318 X |
| 4,646,045 | 2/1987 | Chari et al. | 335/301 |
| 4,694,663 | 11/1987 | Miller | 220/423 |
| 4,758,812 | 7/1988 | Forster et al. | 335/301 |
| 4,765,153 | 8/1988 | Wachi | 62/51.3 |
| 4,782,671 | 11/1988 | Breneman et al. | 62/51.3 |
| 4,819,450 | 4/1989 | Miller | 220/423 |
| 4,890,082 | 12/1989 | Fujita | 335/301 |
| 4,912,445 | 3/1990 | Yamasaki et al. | 335/301 |
| 5,001,448 | 3/1991 | Srivastava et al. | 335/301 |
| 5,017,872 | 5/1991 | Foo et al. | 324/318 X |

OTHER PUBLICATIONS

"Oxford Instruments Specification 500/89 N.M.R. Magnet System" Oxford Instruments Limited, Jun. 20, 1987.
Shuichi Yamaguchi et al., "Diagnosis of Alkaptonuria by NMR Urinalysis: Rapid Qualitative and Quantitative Analysis of Homogentisic Acid", Tohoku J. exp. Med. 150 227, 228.
"Rapid Screening of Metabolic Disease by Proton NMR Urinalysis," The Lancet, Aug. 4, 1984, p. 284.
Morris Traube, et al., "D-Lactic Acidosis After Jejunoileal Bypass: Identification of Organic Anions by Nuclear Magnetic Resonance Spectroscopy", Annals of Internal Medicine, 1983;93:171-173.
Hideaki Yamamoto, et al., "Revised Method of 1H-NMR Urinalysis for Detecting Inborn Errors of Metabolism", Clinical Chemistry, vol. 33, No. 5, 1987.
Richard A. Iles, et al., "Spin-Echo Proton-Nuclear-Magnetic-Resonance Detection of Normal and Abnormal Metabolites in Plasma and Urine", Biochemical Society Transaction 11:374-75 (1983).
J. K. Nicholson, et al., "Mercury and Cadmium Nephrotoxicity and the Detection of Abnormal Urinary Metabolites by Proton N.M.R. Spectroscopy", Human Toxicology, 1984, 334-335.
J. K. Nicholson, et al., "Monitoring Metabolic Disease by Proton NMR of Urine", The Lancet, Sep. 29, 1984, 751-752.
Shichi Yamaguchi, "Recent Advances in the Diagnosis of Inherited Metabolic Diseases Related to NMR Urinalysis", The Physician India, 1986, 3, 29-38.

(List continued on next page.)

Primary Examiner—James C. Housel
Assistant Examiner—David Redding
Attorney, Agent, or Firm—Baker & Botts

[57] ABSTRACT

An NMR clinical chemistry analyzer includes a shield (20) having a plurality of elongate ferromagnetic bars (22) disposed around an NMR magnet (10) and aligned with its axis (13). A probe arm (28) is disposed within the axial bore (12) of the magnet (10) and is articulable in an axial direction to position any one of a plurality of sample modules (32) within the magnetic field "sweet spot" (144) such that tests may be performed on at least one fluid sample within the chosen sample module (32). Counterrotating conductive, nonferromagnetic cylinders (122, 124) are disposed within the axial bore (12) to assure magnetic field homogeneity. Robotics (50, 30, 34) are provided to automatically test fluid analytes without the need for manual changeout of the fluid testing vessel (102) or per-sample electronic shimming.

34 Claims, 5 Drawing Sheets

OTHER PUBLICATIONS

J. K. Nicholson, et al., "Proton-Nuclear-Magnetic-Resonance Studies of Serum, Plasma and Urine from Fasting Normal and Diabetic Subjects", *Biochem. J.* (1984) 217, 365–375.

W. Lehnert, et al., "Possibilities of Selective Screening for Inborn Errors of Metabolism Using High-Resolution H-FT-NMR Spectrometry", *Pediatrics,* 1986, 260–266.

Willy Lehnert, et al., "Screening for Inborn Metabolic Disorders by H-NMR Spectrometry", *The Journal of Pediatrics,* 1986, 166–168.

J. K. Nicholson, et al., "High Resolution H.N.M.R. Studies of Vertebrate Blood and Plasma", *Biochem. J.* (1983) 211, 605–615.

Jay L. Bock, "Analysis of Serum by High-Field Proton Nuclear Magnetic Resonance", *Clinical Chemistry,* vol. 28, No. 9, 1982, 1873–1877.

John R. Bales, et al., "Use of High-Resolution Proton Nuclear Magnetic Resonance Spectroscopy for Rapid Multi-Component Analysis of Urine", *Clinical Chemistry,* vol. 30, No. 3, 1984, 426–432.

R. A. Iles, et al., "Therapy in the Inherited Organic Acidurias Monitored by High-Resolution H-N.M.R. Spectroscopy", 728–729.

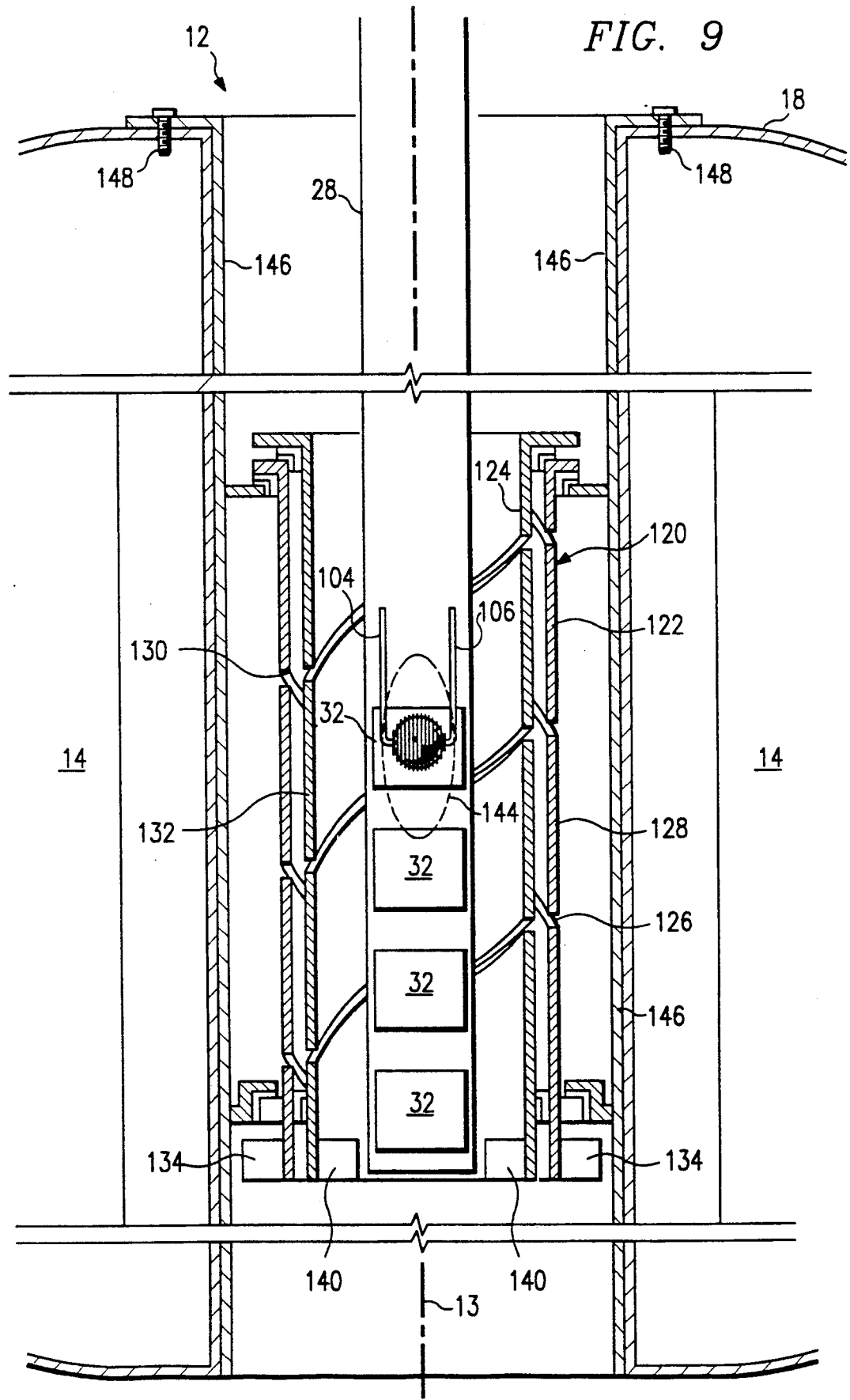

NMR CLINICAL CHEMISTRY ANALYZER AND METHOD OF FORMING A SHIELD

TECHNICAL FIELD OF THE INVENTION

This invention relates in general to nuclear magnetic resonance spectrometry, and more particularly to an NMR clinical chemistry analyzer and method for using same.

BACKGROUND OF THE INVENTION

Clinical chemical analyzers are known in the art which are capable of analyzing multiple analytes. These conventional chemical analyzers use ultraviolet/visible spectrophotometer and ion selective electrode technology to analyze typically from 20 to 32 chemicals, enzymes and ions from one fluid sample.

Several problems arise with the use of conventional clinical chemical analyzers. First, most assays are performed by indirect detection of the actual analyte by coupling an enzyme through a chemical reaction to yield a colored substance. The reagents involved tend to be unstable. Second, many of the test methods are non-linear in their response. Finally, the sample manipulation robotics technology involved is very complex.

The current clinical chemical analyzers also tend to be relatively slow in the production of results. A physician who orders one or more assays using these conventional systems optimally wants results back in 30 to 60 minutes, but usually has to wait 24 to 48 hours. In an effort to make the conventional clinical chemical analyzers to use by non-skilled technicians, manufacturers have tried to make all the required reagents in liquid form. This has resulted in even more complex chemistry and increased problems of stability.

Nuclear magnetic resonance (NMR) spectroscopy is a standard technique for identifying molecular structure and content. However, present NMR clinical spectrometers are ill suited for clinical chemistry applications.

One problem is the tremendous magnetic fringing fields created by conventional NMR instruments, which generally have magnetic field strengths in the range of 9 to 12 Tesla. These magnetic fields are of such a magnitude that ferromagnetic objects of any appreciable mass (0.1 ounce or more) would accelerate toward the NMR magnet while in operation, posing a condition capable of causing injury to personnel in the process. The very large magnetic field strengths generated by conventional analytic NMR magnets are obtained by the use of superconductive coils immersed in coolant baths using cryogens (liquid helium and nitrogen) to reduce the temperature of the coils to a few degrees Kelvin above absolute zero. The large magnetic fields generated by the superconductive coils will, if unshielded, also cause disturbances in nearby electronic apparatus, and have the possible capability of erasing nearby magnetic media (computer tapes, disks).

For this reason, conventional NMR spectrometers are sited within their own rooms suited for the purpose. Ferromagnetic shielding, such as iron or steel plates, are erected remotely, either around the walls of the room or as a portion of the structure of the building in order to increase uniformity of the generated NMR magnetic field, decrease disturbance with surrounding electronic- and magnetic-based devices, contain the fringing field and avoid large forces that might result between the shielding and the magnet itself. Conventional NMR shielding requirements make NMR spectroscopy unsuitable for siting on a vehicle or within relatively restricted areas.

Another problem with conventional NMR spectroscopy is the time that is involved in performing an assay. The NMR magnet has an axial bore in which there is located a prolate spheroidal area of maximum magnetic field uniformity, the so-called "sweet spot." A sample tube is manually filled to a predetermined level with the solution to be assayed and is placed within this "sweet spot" in the axial bore. A signal/sensor radio frequency coil producing an oscillating magnetic field orthogonal to the static field of the magnet surrounds this sample holding tube. Because of variations in the physical placement of the sample and the fluid analyte level, it is necessary to electronically adjust the magnet homogeneity of, or shim, each sample individually. To provide for an increase in uniformity of the field, the sample is spun about the main coil's axis. This sample must therefore be contained in a totally separate container, which container must be placed inside the magnet for each sample to be tested and later removed. For these and other reasons, conventional NMR spectrometers require a large amount of time and expertise to operate. If these problems with NMR spectroscopy could be solved, nuclear magnetic resonance could form the basis for a clinical chemistry analyzer.

SUMMARY OF THE INVENTION

According to one aspect of the invention, a nuclear magnetic resonance clinical chemistry analyzer is provided with a shield that substantially reduces the magnetic fringing field at locations external to the cryogenic vessel ("Dewar") of the magnet. The shield includes a plurality of elongate ferromagnetic bars disposed around the magnet and aligned with its axis, with each bar equally spaced from the other. A non-ferromagnetic framework rigidly positions the bars in a predetermined relationship with each other and the magnet. In a preferred embodiment, each shield bar curves convexly inwardly from an equator of the magnet coil, after the manner of a barrel, in order to substantially conform to one or more isomagnetic lines of the field. To compensate for the increased concentration of isomagnetic field lines as one approaches the ends of the solenoidal coil of the NMR magnet, the thickness of the bars is increased towards the bars' ends in relation to the thickness of the middle of each bar. Preferably, the bars may be adjusted relative to the framework to specially position the bars.

According to another aspect of the invention, the axial bore of the NMR magnet is fitted with a pair of counter-rotating conductive non-ferromagnetic cylinders in order to increase the uniformity of the generated magnetic field within a predetermined test volume. The cylinders are preferably caused to rotate by a non-mechanical, hydraulic mechanism, such as compressed air acting on a plurality of angled blades affixed to each cylinder. In a particularly preferred embodiment, each cylinder is formed by a plurality of helical current paths to control current flow of electrical current set up by rotation of a conductive material in a magnetic field (so called eddy currents).

According to another aspect of the invention, a probe arm of the clinical chemistry analyzer comprises a plurality of sample modules, each sample module having at least one sample chamber. The probe arm is moved axially within the axial bore of the magnet to bring a selected one of the sample modules in alignment with the "sweet spot" of the magnetic field generated by the NMR coil. A conductive signal and sensor coil is provided for each sample module, which coil is wound in a direction perpendicular to the axis of the static field and to surround the sample chamber(s). Each sample chamber or vessel has an inlet tube for the introduction of a fluid sample and an outlet tube for removing the fluid sample. Preferably, each sample chamber is spherical to achieve maximum uniformity of the position of the sample with respect to the NMR magnetic field.

One advantage of the present invention is that the sample chamber does not need to be spun about its axis, and further does not need to be removed from the probe arm for each new sample. These advantages in turn will allow a very precise placement of the sample chamber with respect to the axis for optimum uniformity of NMR test results. Because the sample chamber does not need to be replaced, the NMR magnet can be electronically shimmed once upon setup without any further reshimming required by the operating personnel. A fluid sample to be analyzed is simply injected into the fluid chamber, the experiment(s) run, and the fluid sample removed and the chamber flushed. The extremely automated nature of the entire procedure allows for a very quick determination of NMR results, thus making the invention suitable for clinical chemistry analysis where results are needed very quickly.

The present invention allows the rapid determination of bacterial contamination of body fluids, toxic drug and metal contaminations and otherwise difficult enzyme activity measurements. Such determinations can be accomplished in two to 160 minutes by NMR, as compared with 24 to 48 hours by present methods.

The present invention further allows many tests on biologic fluids that are direct in their nature, requiring no sample preparation or treatment. This allows cheaper, faster and more accurate analyses. Software associated with the invention is able to measure several compounds at once, such as 100 or more, and do so within fifteen minutes or less. Bacterial contaminations may be measurable within one to two hours, and a general typing of the bacterium may be given within this period. For rapid determinations of meningeal, blood and urinary tract infections, the present invention reduces the time to select the appropriate antibiotic to hours from days.

BRIEF DESCRIPTION OF THE DRAWINGS

Further aspects of the invention and their advantages may be discerned in the following detailed description when taken in conjunction with the drawings, in which:

FIG. 9 is a schematic axial sectional detail of a portion of the bore of the magnet according to the invention, showing the positioning of the counter-rotating cylinders of FIG. 8 and the probe of FIG. 7 in relation thereto;

DETAILED DESCRIPTION OF THE INVENTION

Figure 1:
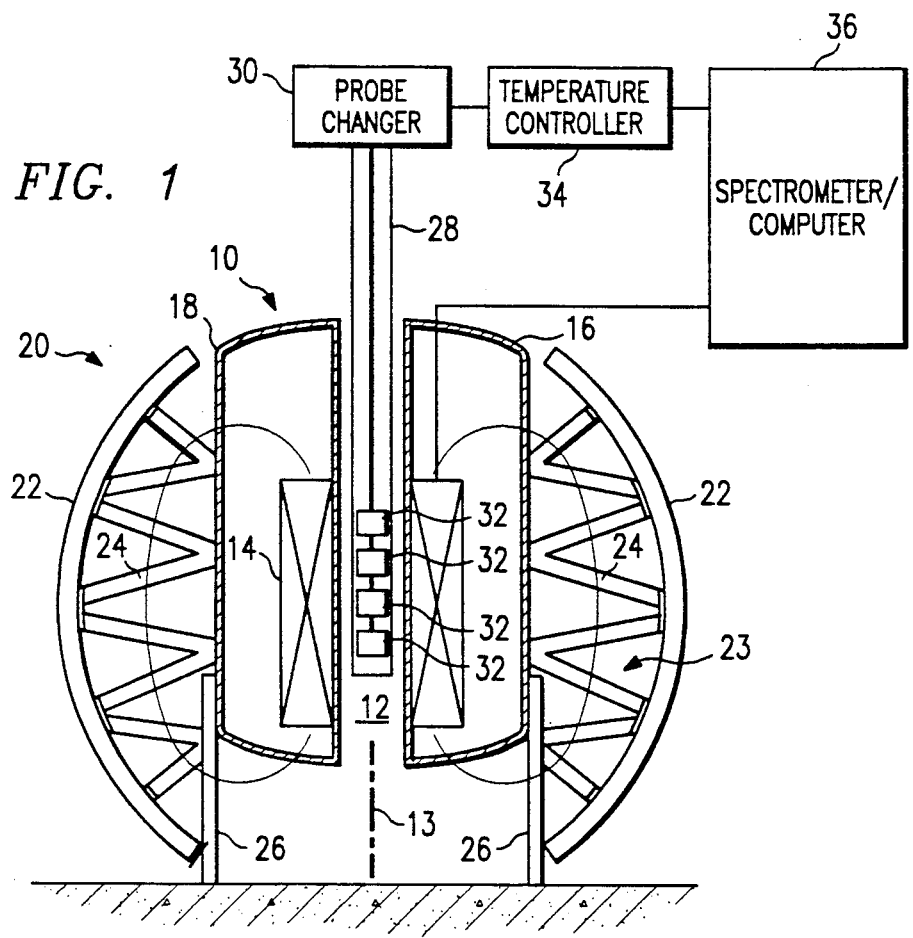
FIG. 1 is a part-elevational, part-schematic illustration of an NMR clinical chemistry analyzer according to the invention.

A schematic representation of the main components of an NMR clinical chemistry analyzer according to the invention is shown in FIG. 1. A nuclear magnetic resonance (NMR) magnet is indicated generally at 10. The magnet 10 has an axial bore 12 around an axis 13 (indicated by the dashed line) and is comprised of two basic components: a main coil or winding 14, indicated in section by the "x"ed boxes, of a superconductive material, and a container 16 for insulating and typically containing the cryogenic fluids liquid helium and liquid nitrogen (see FIG. 3 for more detail). In a preferred embodiment, the main coil 14 consists of a superconductor made of a niobium-tin intermetallic compound in the form of a wound multifilament wire. The coil 14 is brought down to a superconducting temperature by a bath of liquid helium (not shown). The liquid helium is contained within a Dewar container arrangement and is in turn enclosed by another Dewar container (not shown) filled with liquid nitrogen. The entire assembly is jacketed by an exterior wall 18 that preferably is either stainless steel or aluminum.

A magnetic field shield indicated generally at 20 comprises a plurality of ferromagnetic bars or slats 22 which are preferably curved in order to conform to the shape of a preselected isomagnetic line (a nonselected line shown displaced inwardly from bars 22) of the magnetic field generated by magnet 14. Bars 22 are disposed radially around the axial bore 12. The ferromagnetic bars 22 are held in place by a non-ferromagnetic rigid support structure 23. The entire assembly is supported on a floor by a plurality of legs 26 (two shown).

An elongated cylindrical sample probe arm 28 is disposed in alignment with axis 13 within the axial bore 12. The probe 28 is capable of being moved in an axial direction by a probe changer indicated schematically at 30. For maximum rigidity in any nonaxial direction, the probe arm 28 should be guided by one or more rails (not shown) aligned with axis 13. The probe arm 28 includes a plurality of sample modules 32 that are arranged axially in relation to each other. Each module 32 contains at least one fluid sample chamber (not shown in FIG. 1) into which a fluid sample is introduced for NMR analysis.

The probe changer 30 pneumatically manipulates the probe arm 28 with appropriate solenoid, valve and other electromechanical devices, which are as remote from the magnet 10 as possible. This is done in order to decouple such devices from the magnetic field generated by magnet 14 and to avoid malfunction of such electromechanical devices within the relatively high intensity magnetic field generated by the main coil 14.

The construction of NMR magnet 10 is known in the art. An NMR magnet suitable for modification according to the invention may be obtained from Oxford Instruments of Oxford, United Kingdom. In one such magnet, the radius of the axial bore is approximately 88 to 89 mm. The length of the exterior container 16 is about 1.42 m. In operation, the magnetic coil 14 of one Oxford NMR magnet can generate a magnetic field having a strength of 11.7 Tesla.

In magnets of this type, a "sweet spot" (see FIG. 9), or region in which the generated magnetic field is very uniform, is produced by the magnetic coil 14. This "sweet spot" is prolately ellipsoidal in shape and is centered approximately 44 cm from the bottom end of the container 16. The "sweet spot" is approximately 20 mm in diameter in a direction perpendicular to the axis 13, and is from 30 to 35 mm in length in a direction parallel to the axis 13. Each of the fluid sample modules 32 is dimensioned to fit entirely within this "sweet spot" when appropriately positioned by the probe changer 30.

While NMR experiments are being conducted on various fluid samples, it is important that the temperature of the fluid sample module 32 be carefully controlled. This function is performed by a temperature controller 34. The temperature controller 34 has temperature sensors (not shown) within the axial bore 12 and/or probe arm 28. Appropriate devices (not shown) are provided to force heated or cooled compressed air, nitrogen gas or other fluid down the axial bore 12 in order to control the temperature of the module 32. The temperature controller 34 may, for example, have a heating and a cooling unit which is electronically controlled according to the temperature sensed within the axial bore 12, together with a hydraulic mechanism for forcing air of the appropriate temperature into the axial bore 12 and to circulate around the modules 32.

It is preferred to maintain the temperature of the interior of the modules 32, and more generally the interior of the probe arm 28, at approximately 37° C. However, the temperature controller 34 has controls associated with it to change the desired temperature to other temperatures, such as 30° C. This feature of the clinical chemistry analyzer allows conformance of the analyzer to the regulatory requirements of various countries.

A spectrometer/computer 36 is provided to operate the magnet 10, the probe changer 30 and the temperature controller 34. The spectrometer/computer 36 controls the power supply fed to the main magnet coil 14 before persistence is obtained, supplies the RF coils (not shown in FIG. 1) associated with each of the sample modules 32 with appropriate signals, and receives data signals back therefrom. The spectrometer/computer 36 may be a Sun 4/260 computer. Computers of approximately this speed and capacity are suitable for running the system software described in more detail in conjunction with FIG. 2.

The shield 20 has the object of greatly reducing the strength of the magnetic field exterior to the container 16. With the shield in place, the five Gauss line of magnetic field strength is brought within a few feet of the axial bore 12. This provides a significant advantage over prior art systems, which typically shield the entire room or building. Because the strength of the magnetic field exterior to the magnet 10 is greatly reduced, it is possible to place the probe changer 30, temperature controller 34 and spectrometer/computer 36 within the same room as the NMR magnet 10. In a preferred embodiment, the five Gauss line is brought within ten feet away from the axis 13 of the magnet 14. This allows the installation of the clinical chemistry analyzer within a single room, or even on a vehicle.

Figure 2:
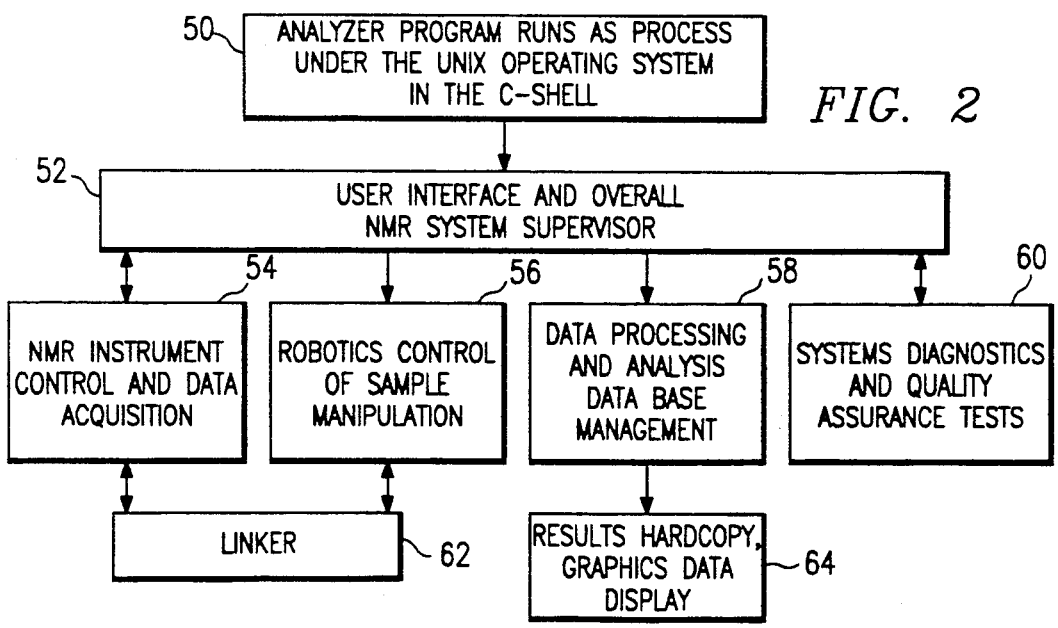
FIG. 2 is a block diagram showing the functions of a computer software system for use in conjunction with the invention.

FIG. 2 is a schematic block diagram of software used in the implementation of the invention. As indicated by block 50, in a preferred embodiment of the invention, the analyzer program runs as a process under the Unix operating system in a C-shell. An executive program module is indicated at 52. The executive program 52 controls the operation of subsidiary software modules 54-64. The executive module 52, for example, determines when the NMR instrument control and data acquisition module 54 begins operation. It also instructs module 54 as to which of a plurality of different experiments should be run on the sample.

The executive module 52 further controls the operation of a robotics control/sample manipulation module 56. Commands are input from module 50 and are interpreted by the executive program 52. In one embodiment, several fluid samples that are to be tested are arranged on a carousel (not shown). A command may be entered through module 50 and interpreted by module 52 to take up fluid within a particular fluid sample in the carousel, and transfer it to one of the fluid sample modules 32 within the axial bore 12 through appropriate tubing later described. The identity of this particular fluid sample is kept track of by the executive program 52. The data gathered in relation to this fluid sample is flagged with the fluid sample's identity.

The executive program also controls the operation of a data processing and analysis module 58, a system diagnostics and quality assurance module 50, and a data output module 64.

The NMR control and data acquisition module 54 will run an experiment according to instructions received by it from the executive program 52. These instructions include the type of sample involved, such as a standard sample, statistical sample or special analysis sample, and atomic species to be detected, such as phosphorus, carbon, nitrogen, fluorine, hydrogen, sodium or potassium.

Block 58 processes and analyzes the data received back from the magnet 10. This software module also manages the data base against which the raw data may be compared and into which the raw data may be incorporated. The data processing and analysis module 58 incorporates various algorithms for processing the data, including numerical methods for peak identification, deconvolution of overlapping signals, J-coupling connectivities, and quantitation.

Module 60 concerns system diagnostics and quality assurance tests. The data of statistical samples and standardized samples are processed in software module block 60 to correctly calibrate and interpret measurements of the actual test samples.

A linker module block 62 links the software functions of the robotics control module 56 and the NMR instrument control module 54 such that these two activities may be coordinated. A data output block 64 is responsible for displaying the results, either in terms of hard copy or on a CRT display, or both.

The robotics control module 56 controls the function of probe changer 30 in the filling and flushing of the sample modules 32. For example, one protocol would be to first flush a selected one or more of the sample modules 32 with a detergent solution and then a rinse. Second, each module 32 is filled with at least one fluid sample which, for example, may be selected from a carousel, the fluid being injected into sample chambers (not shown in FIG. 1) by suitable input tubes (not shown in FIG. 1). Third, the module 56 controls the probe changer 32 to pneumatically position a selected sample module 32 for the first test within the "sweet spot" generated by main coil 14. Once a particular test or series of tests have been run on the selected sample module 32, as controlled by program module 54, the probe changer may change the position of the probe 28 such that another sample module 32 is in the magnetic "sweet spot" and so that the same or a different series of tests may be performed on it. Once all desired tests have been run, the samples are flushed and the system is ready for another testing cycle.

Figure 3:
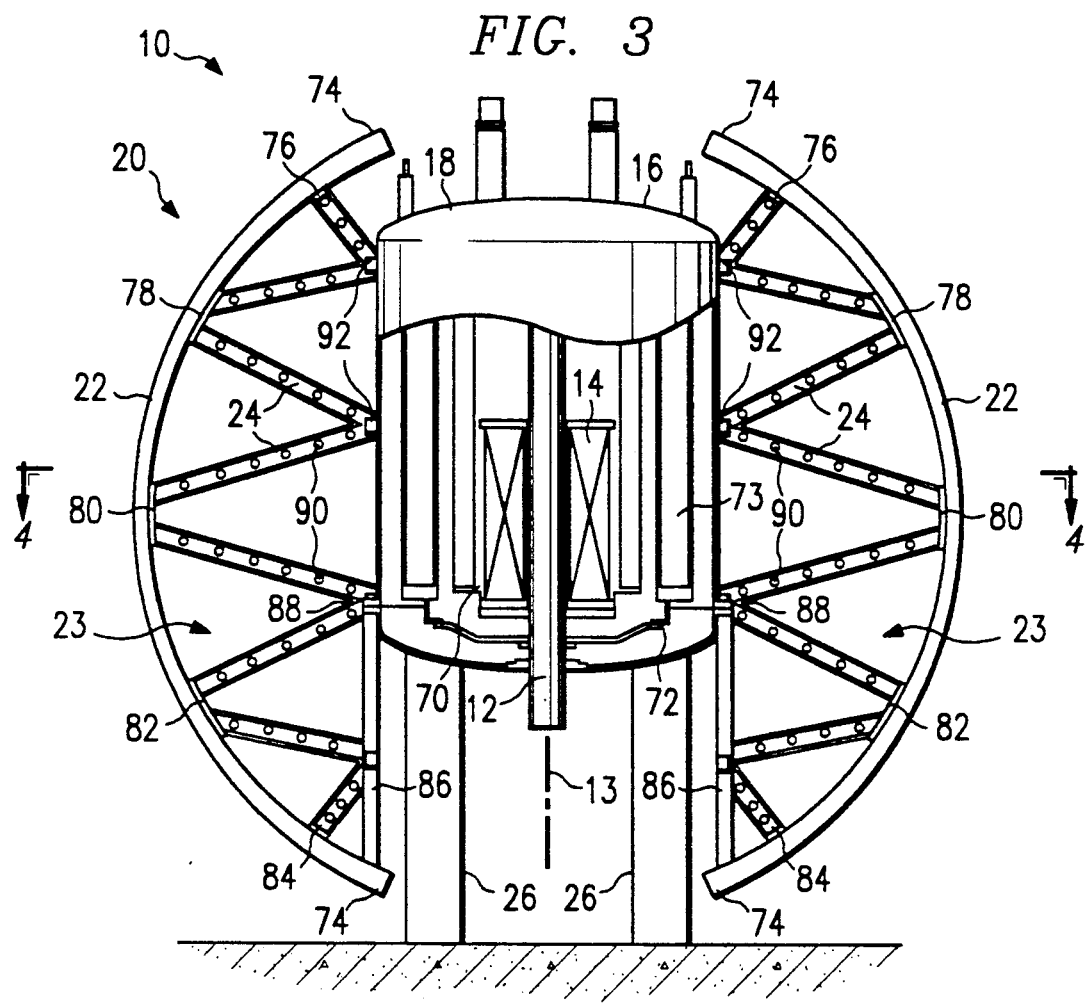
FIG. 3 is an elevational section of a nuclear magnetic resonance magnet and shield according to the invention, shield members being shown in an elevational section and other portions of the magnet having parts broken away in order to show detail.

FIG. 3 is a more detailed elevational, part-sectional view of an NMR instrument 10 and shield 20 with parts broken away to show detail. As noted above, the container 16 for the NMR magnet 14 is actually a pair of Dewar vessels, one enclosing the other. The NMR superconducting coil 14 is immersed in a bath of liquid helium that is contained within a Dewar vessel 70. The Dewar vessel 70 has vacuum-separated interior and exterior walls. It is surrounded by a second Dewar vessel 72 that contains liquid nitrogen. These Dewar vessels, together with the necessary support structure, helium and nitrogen feeds and appropriate retractable electrical feeds for the main coil 14, are enclosed by a jacket 18 which may for example be fabricated of stainless steel.

Each bar or slat 22 is formed of iron, steel or other ferromagnetic material, and is curved to conform substantially to the shape of one or more preselected isomagnetic lines (actually surfaces of flux; not shown in FIG. 3) of the magnetic field generated by the main coil 14. The bars are preferably approximately two inches wide and one inch in thickness at the equator of the magnet 10, and are dimensioned to be longer than the axial dimension of the jacket 18. Ends 74 of each bar 22 are disposed so as to at least partially overlap the jacket 18 in order to provide increased shielding to take into account the crowding of magnetic force lines near the ends of the axial bore 12. Because of the concentration of magnetic force lines at the top and bottom of the axial bore 12, the ends 74 of each bar 22 are preferably made thicker than the thickness of the bars 22 at the equator of the instrument. The bars 22 are arranged to be radially symmetrical about an equator of the magnetic coil 14, rather than the middle of the jacket, as the center of the main coil 14 is axially displaced from the center of the entire container 16.

Each bar 22 is rigidly held away from the jacket 18, and from each other, by a plurality of non-ferromagnetic struts 24, which for example may be fabricated of aluminum. If the bars 22 are perfectly radially symmetrical with respect to each other and the axis of the instrument, there will be little or no force exerted on them by the magnetic field. It is therefore very important to provide an extremely rigid and precise framework 23 to hold the bars 22 in their intended positions. The dimensional tolerances are preferably on the order of 0.010 inch. Each bar 22 should be as close to the jacket 18 as the following permit: (a) lack of mechanical interference with other components of the instrument such as probe arm 28, (b) forces generated on the framework by the magnetic field because of the lack of perfect symmetry, and (c) the conformance of each bar 22 to the shape of a preselected isomagnetic line of the field. Preferably, the bars 22 should each be positioned at a constant distance away from axis 13 in the range of 36 to 40 inches as measured at the equator of the magnet.

A realization of one such framework is shown in the illustrated embodiment. This embodiment comprises a plurality of aluminum struts 24 that form a tressel-like structure both in the axial and in the radial direction (see also FIG. 6). The framework 23 formed by strut members 24 has a plurality of footings 76–84 for the attachment or affixation of appropriate bars 22. Five such footings 76–84 are shown in the illustrated embodiment for each bar 22; this number of attachment points or footings may be varied to be more or less according to the materials used for the struts 24 and the relative requirements for rigidity in view of the magnetic field strength of the magnet 10. The middle footings 78–82 are each the terminals of, in the illustrated embodiment, four struts 24 (only two shown in FIG. 3) extending from them toward four different attachment points 88 on the jacket 18. Each footing 78–82 therefore is joined to the exterior surface of the jacket 18 at four points disposed in a pyramidal relationship with the attachment points 88. For this purpose, the surface of the jacket 18 is extended by an elongate member or members 86 to provide further points of attachment of the struts 24. The end footings 76 and 84 each have only two struts 24 (only one apiece shown) emanating from them.

Figure 4:
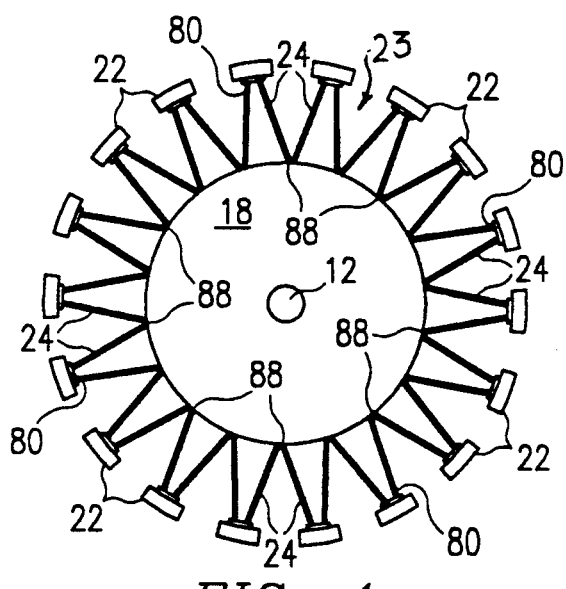
FIG. 4 is a detail of FIG. 3, showing the attachment of a shield framework to an NMR shield bar by the use of a preselected shim and allowing for angular adjustment.

A top schematic sectional view particularly illustrating the support structure 20 is shown in FIG. 4. As can be seen with reference to both FIGS. 3 and 4, there exist a plurality of attachment points 88 at or near the surface of the stainless steel jacket 18. In the section illustrated, each of the attachment points 88 has four struts 24 emanating from it, two that are shown and two which are above the sectional plane. Each attachment point 88 will have a pair of struts running to one bar 22, and a pair of struts running to another neighboring bar 22. Thus, looking from the point of view of either a bar 22 or the surface of the jacket 18, the struts are arranged in an extremely strong pyramidal tressel for maximum rigidity.

It is preferred that the struts 24 be fabricated from aluminum, although other strong nonferromagnetic materials may be used. The weight of the struts 24 may be reduced by forming holes 90 therein (FIG. 3) so as to reduce the struts, weight without appreciably reducing the struts, strength. In order to surmount the problem of joining aluminum to steel or the like, lugs 92 may be provided on the exterior of the stainless steel jacket 18.

FIG. 4 shows the pyramidal arrangement of struts 24 between the attachment points 88 on the exterior of the jacket 18 and the footings 80 adjacent the iron bars 22. As mentioned above, it is preferred that the iron bars in their equatorial section be approximately two inches wide and about one inch thick. The spacing between the ferromagnetic bars 22 is also approximately two inches. This spacing and width of each bar provides an optimum shielding capability without excess weight.

Figure 5:
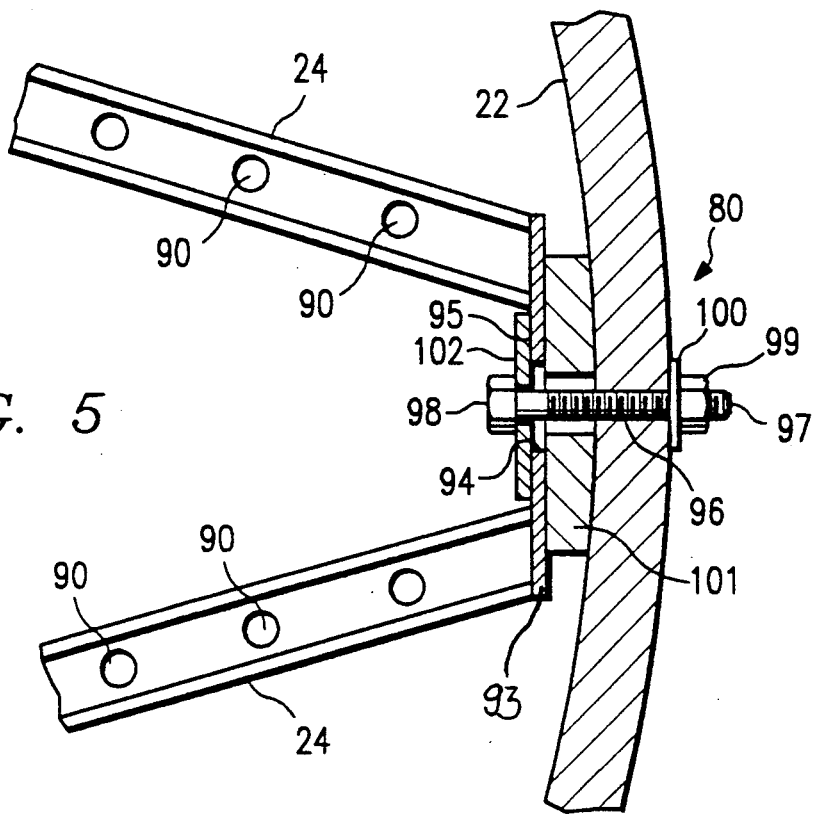
FIG. 5 is a view of the framework/bar attachment shown in FIG. 4 looking radially outwardly from the NMR magnet.

FIG. 5 is a detailed elevational sectional view of an equatorial footing 80 showing its relationship to two of the four respective struts 24 and one of the ferromagnetic bars 22. The struts 24 terminate in a nonferromagnetic plate 93 that has a large central bore or other opening 94, and an open face of appreciable area 95 is provided between the innermost junction of the strut 24 with the plate 93 and the edge of bore 94.

A borehole 96 is bored radially through the ferromagnetic bar 22 to receive a bolt 97. The bolt 97 has, e.g., a hexagonal head 98 and is threaded to receive a nut 99. An exterior washer 100 is disposed, in final assembly, between the exterior surface of the bar 22 and the nut 99. The bolt 97 is further inserted through a shim 101 that has a predetermined thickness in a direction radial to the center of the magnet. In a preferred embodiment, the installer of the NMR magnet is provided with a set of shims 101 of different thicknesses so that one of the set of shims 101 can be used to precisely position the bar 22 a predetermined radius away from the axis 13. Like shim sets are provided for the other footings 76-84.

Figure 6:
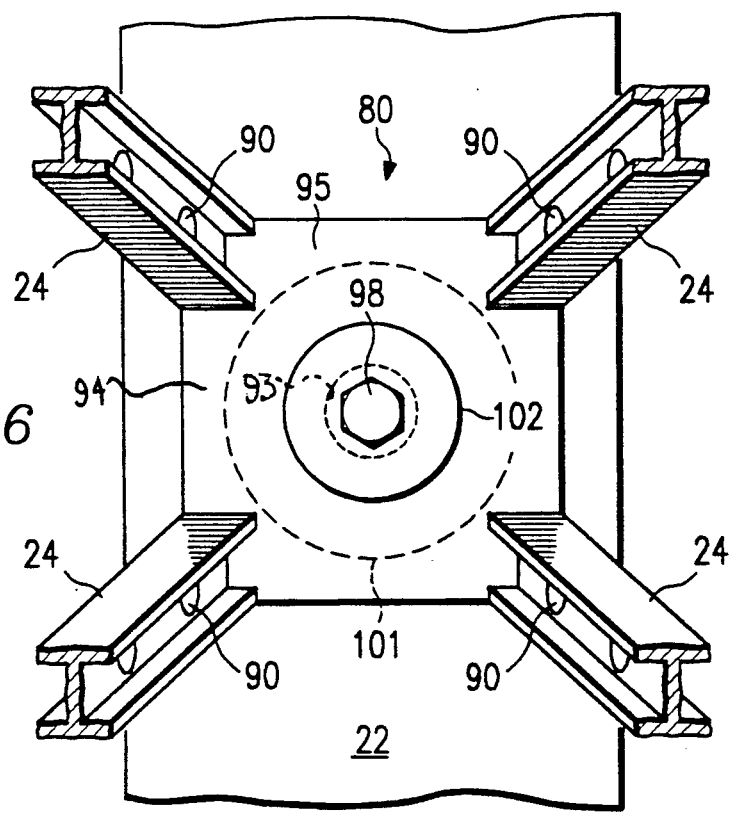
FIG. 6 is a schematic plan view of a nuclear magnetic resonance magnet and shield according to the invention, illustrating the relative positioning of the magnet, shield bars and support structure.

The bolt 97 is further inserted through a large washer 102 that is sized to have a large overlap over the hole 94. This allows the struts 24 and the end plate 93 to be precisely positioned in terms of horizontal and vertical angle with respect to the center of the "sweet spot". It is preferred that bolt 97, nut 99, washers 100 and 102, and shim 101 all be fabricated of nonferromagnetic materials. FIG. 6 is an interior radial view of the footing 80, as viewed from the center of the magnet.

Figure 7:
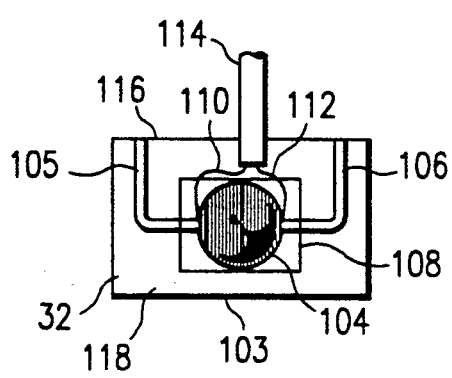
FIG. 7 is a schematic detail of a single fluid sample module according to the invention, with parts broken away to show detail.

Referring now to FIG. 7, a single sample module 32 is shown in more detail. The module 32 is assembled inside a container 103 for containing all of the various components of the module 32. The module 32 is provided with a preferably spherical sample vessel or chamber 104 that is aligned with the axis 13 of the main coil 14. The vessel 104 is preferably formed of borosilicate glass, quartz or other smooth, nonconducting, chemically inert material. The module 32 further has an inlet tube 105 that opens on the interior surface of the vessel 104 and communicates with the probe changer 30 (FIG. 1). A similar exit tube 106 also opens on the interior surface of the vessel 104, and is preferably disposed 180 equatorial degrees from the inlet tube 105. Tube 106 also communicates with the probe changer 30 (FIG. 1). The inlet tube 105 is used to introduce the fluid sample into the vessel 104. The outlet tube 106 acts as an aspiration tube and further as an exit tube to flush the fluid sample out of the container 104 and any flushing detergent solution after it.

The vessel 104 is carefully fixed in place on the axis 13 of the main coil 14 (FIG. 3) and is intended to be permanently installed, thereby obviating the need for careful positioning of sample test tubes and the like and reshimming of the instrument. In another embodiment (not shown), the spherical vessel 104 may be replaced with a cylindrical vessel.

A pulse and detection coil 108 is carefully wrapped spirally around the exterior surface of the vessel 104 from one pole to another pole of the spherical vessel 104. The poles are, in the embodiment of FIG. 7, aligned with the inlet and exit ports associated with tubes 105 and 106. The coil 108 is wrapped such that it is perpendicular to the field generated by the main magnetic coil 14. Two electric leads 110 and 112 connect the RF coil 108 to the exterior of the instrument and more particularly with the spectrometer/computer 36. In order to fit completely within the "sweet spot" of the illustrated magnet 10, the assembly of the pulse and detection coil 108 and the spherical vessel 104 should be no more than approximately 4 ml in volume.

The electric leads 110 and 112 exit the sample module 32 as a radio frequency (RF) coaxial cable 114. This, together with a bundle (not shown) of like cables from the other modules 32 (see FIG. 1), exits the axial bore 12 of the main coil 14 within the probe arm 28 and is connected to the spectrometer/computer 36.

Figure 12:
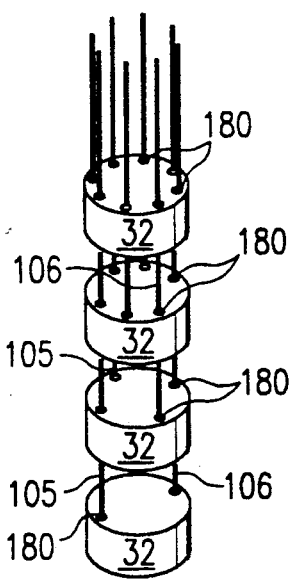
FIG. 12 is a schematic isometric view showing the serial arrangement of the sample modules within a probe arm and the entrainment of inlet and outlet tubes.

Together with tubes from similar sample modules 32, the tubes 105 and 106 form a bundle inside the probe arm 28. The tubes 105 and 106 communicate with fluid sample intake and discharge apparatus (not shown) associated with probe changer 30 (FIG. 1). The tubes 105 and 106 may be formed of plastic or glass. As shown in FIG. 12, one method of aligning the tubes 105 and 106 from the various modules 32 is to pass the tubes through each successive module or 32 until the last such module or canister 32 is passed. For this purpose, the tubes 105 and 106 can be radially arranged such that they are angularly displaced from each other. Top and bottom walls 116 and 118 of the module 32 may each have a series of holes (not shown in FIG. 7) drilled through them to permit the passage of tubes from other modules completely through the module 32. The tubes 105 and 106 do not have to be particularly large, and in the illustrated embodiment are approximately 4 to 5 millimeters in their exterior diameter.

Once the tubes 105 and 106, and like tubes from the other modules 32, exit the bore 12, the ends thereof are affixed to respective ends of flexible tubes (not shown) made of a relatively inert flexible material such as TYGON polyethylene, or even more preferably a polyethylene tubing coated on its interior with teflon. Teflon is preferred because of its highly inert and non-hydroscopic properties. Electronic sensors (not shown) are placed within the interior of the axial bore 12 and on the surface of the probe arm 28 in order to determine the axial position of the probe arm 28 relative to the magnet coil 14. It is important to avoid the use of ferromagnetic materials, such as steel leads, in these electronic sensors wherever possible. The sensors have appropriate conductive, non-ferromagnetic leads to the probe changer 30 so that the probe changer 30 may sense the position of the probe arm 28 relative to the bore 12.

Figure 8:
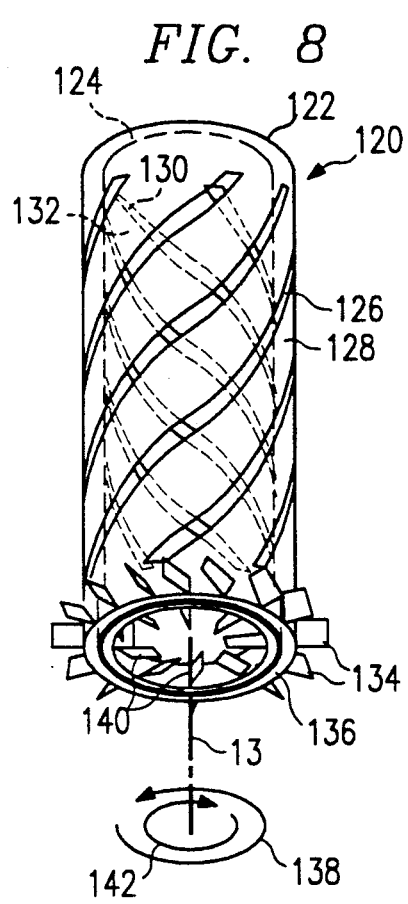
FIG. 8 is an isometric, schematic detail of a pair of counter-rotating conductive cylinders for use in the NMR magnet of the invention, an interior one of the cylinders depicted in phantom.

A schematic representation of a magnetic field homogenizer unit is indicated generally at 120 in FIG. 8. The unit 120 is fit within the axial bore 12 (FIGS. 1 or 9) to be symmetrically positioned around the magnetic field "sweet spot" located at the center of the main coil 14 (FIG. 9). The homogenizer unit 120 includes a first, exterior cylinder 122 fabricated from a tube of thin-wall, non-ferromagnetic conductive material such as copper. Disposed concentrically within the exterior cylinder 122 is an interior cylinder 124, preferably formed from the same conductive non-ferromagnetic material used for cylinder 122. Cylinders 122 and 124 are aligned with the axis 13 of the main coil 14 (FIGS. 1 or 9). The cylinder 122 preferably has a plurality of helical channels 126 formed in it that separate the copper cylinder 122 into several helical current paths 128. Interior cylinder 124, shown for the most part in phantom in FIG. 8, similarly has a plurality of helical channels 130 that divide the cylindrical surface of the cylinder 124 into a plurality of helical conductive paths 132 that spiral in an opposite direction from current paths 128. The sample module 32 (FIGS. 1, 7, 9) selected for testing is dimensioned to fit within the interior of the inner cylinder 124 and totally within the magnetic "sweet spot".

The cylinders 122 and 124 are made to rotate in opposed directions. The counter-rotating action of cylinders 122 and 124 makes the magnetic field interior to the cylinders 122 and 124 more homogeneous. The magnetic field exterior to the cylinders 122 and 124 will cause currents to flow within the helical conductive strips 128 and 132. Since the cylinders 122 and 124 are forced to rotate in opposite directions, these induced currents will cancel out and will thus improve the homogeneity of the magnetic field interior to the cylinder 132, by averaging local nonuniformities to near zero.

The cylinders 122 and 124 are preferably caused to counter-rotate using a hydraulic fluid such as compressed air, or by using some other non-conductive apparatus. In the illustrated embodiment, dielectric fins 134 are positioned on the exterior surface of the cylinder 122 at a lower end 136 thereof. The dielectric fins 134, which for example may be fabricated out of plastic and which for example may be affixed to cylinder 122 by pegs (not shown) for press-fit insertion into appropriate holes (not shown) within the cylinder 122, are angled with respect to the axis 13 to impart rotating motion in a first angular direction 138 to the external cylinder 122. A second set of fins 140 are affixed to the interior surface of the cylinder 124 in a similar manner. The fins 140 are angled in the other direction so as to impart a counter rotating force to the interior cylinder 124, in an angular direction 142. In order to cause the cylinders 122 and 124 to rotate, compressed air is forced through the bore 12. A suitable remote compressed air source (not shown) may be actuated by software module 56 through appropriate electromechanical relays (not shown) before tests are run on any particular sample.

In an alternative embodiment (not shown), counterrotating copper or other nonferromagnetic metal cylinders are provided for each sample module 32, and are disposed within the container 100 (FIG. 5) for each module. Suitable mechanical components, such as bearing races, are provided for each module to allow to counterrotation of the copper cylinders. Forced air entrance and exit vents are provided in order to impart rotating motion for each set of counterrotating cylinders.

FIG. 9 is an elevational sectional detail of a portion of the magnetic bore indicated generally at 12, showing the positioning of the main magnet coil 14, external cylinder 122, internal cylinder 124 and the probe sample modules 32 in relation to each other. The cylinders 122 and 124 in the illustrated embodiment are approximately six inches long, and cover only a portion of the interior of the axial bore 12. This portion, however, entirely includes the "sweet spot" of maximum magnetic field homogeneity, indicated by a dashed oval at 144. The sample arm 28 is articulated axially to cause fluid sample modules 32 to enter and exit the confines of the "sweet sport" 144 according to the testing program engaged. In the illustrated embodiment, the exterior diameter of the probe arm 28 (including modules 32) is made to be smaller than the interior diameter of the ends of interior cylinder fins 140. In an alternative embodiment, the turbine fins 134 and 140 may not be mounted to the ends of the cylinders 122 or 124 themselves, but to mechanical extensions of them so that they do not interfere with the articulation of the probe arm 28. For example, elongate rigid extensions (not shown) of the cylinders 122 and 124 may be brought down to a lower point within the axial bore 12, and appropriate rings may be attached to the mechanical extensions for the affixation of the fins 134 and 140.

For ease of maintenance, the counterrotating cylinders 122 and 124 are supported by a sleeve 146 that is tightly fit into the axial bore 12. Tubular sleeve 146 is preferably fabricated of a nonferromagnetic and nonconductive material. The sleeve 146 is affixed to the stainless steel jacket 18 by suitable fasteners such as screws 148 or the like.

Figure 10:
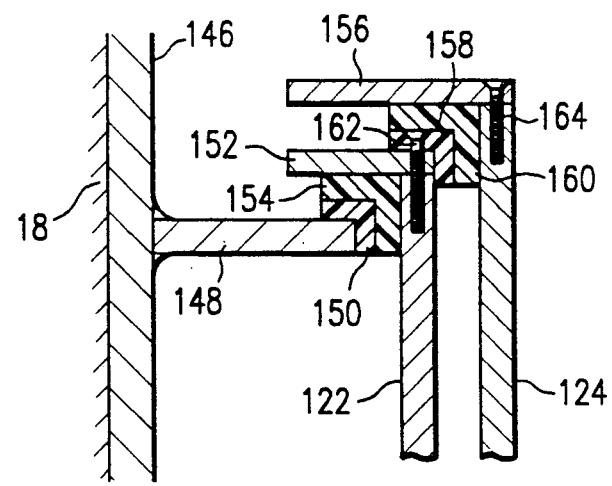
FIG. 10 is a schematic sectional detail of FIG. 9 showing an upper support structure for the counter-rotating cylinders.

The counterrotating copper cylinders 122 and 124 are supported by the sleeve 146 in a manner that allows them to freely rotate about the axis 13, but nonetheless prevents lateral or axial movement. FIG. 10 is a sectional detail of portions of sleeve 146, cylinder 122 and 124 showing one embodiment for the upper support of the cylinders 122 and 124. According to this embodiment, a metallic or other rigid annular flange 148 is affixed as by welding to the interior surface of the sleeve 146. On the end of the flange 148 and on a portion of the upper surface thereof, a teflon bearing surface 150 is affixed as by gluing or other appropriate method to the flange 148. The copper cylinder 122 has an outwardly extending annular flange 152 that extends to overlap the flange 148. At least a portion of the bottom surface of the flange 152 and an uppermost portion of the exterior surface of the cylinder 122 have affixed thereto, as by gluing or other suitable means, a dielectric bearing surface 154, which, for example, may consist of nylon. Preferably, bearing surfaces 150 and 154 are composed of high density synthetic resins having substantially different molecular structure, such as nylon on the one hand and delrin or teflon on the other. As mated together, surfaces composed of these materials provide a very small coefficient of friction.

In a similar manner, the inner cylinder 124 has an outward annular flange 156 which at least partly extends beyond the cylindrical wall of cylinder 122. The uppermost portion of the interior surface of the cylinder 122, and at least an innermost portion of the upper surface of flange 152, have adhered or otherwise affixed thereto a bearing surface 158 which for example may be composed of teflon. A mating bearing surface 160 is affixed to an uppermost exterior surface of the cylinder wall of cylinder 124, as well as at least an innermost portion of the lower surface of the flange 156. The provision of the bearing surfaces 150, 154, 158 and 160 allows an axial rotation of the outer cylinder 122 with respect to the flange 148 and allows a counterrotation of the cylinder 124 with respect to the outer cylinder 122, but nonetheless supports all or a portion of the weight of cylinders 122 and 124 and prohibits lateral or downward displacement. The flange 152 is affixed to the cylinder wall of cylinder 122 by a removable fastener such as screws 162 (one shown). Likewise, the flange 156 is fastened to the cylindrical wall of the interior cylinder 124 by means such as screws 164 (one shown). The flanges 152 and 156 are removably fastened to their respective cylinders 122 and 124 for the purpose of assembly and disassembly of the field homogenizer components.

Figure 11:
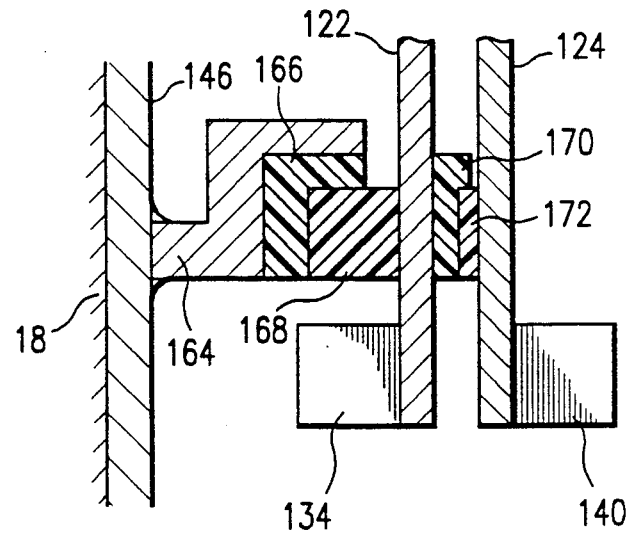
FIG. 11 is a schematic sectional detail of FIG. 9 showing a lower support structure for the counter-rotating cylinders.

FIG. 11 is a schematic sectional detail showing the lower support structure for the cylinders 122 and 124. An annular flange 166 is affixed to the interior wall of the sleeve 146 as by welding. The flange 164 forms an (in section) L-shaped recess to which an L- shaped bearing surface 166 is adhered or otherwise affixed. A mating bearing surface 168 is affixed, either directly or by means of a flange, to a lower portion of the exterior surface of outer cylinder 122. As for the upper bearing surfaces 150, 154, 158 and 160, the bearing surfaces 166 and 168 are made of high density synthetic resins of different molecular structure to obtain a very low coefficient of friction between them.

An L-shaped bearing surface 170 is adhered or otherwise affixed to the interior surface of the outer cylinder 122. A mating bearing surface 172 is adhered or otherwise affixed to a portion of the outer surface of the interior cylinder 124. The bearing surfaces 166, 168, 170 and 172 allow cylinder 122 to rotate with respect to the flange 164, and allow the interior cylinder 124 to counterrotate with respect to cylinder 122, while at the same time preventing upward or lateral displacement.

FIG. 12 is a schematic isometric view best illustrating the relationship of the modules 32 with respect to each other. In the illustrated embodiment, the modules 32 are assembled within the probe arm 28 (FIG. 9) as a serial stack. The lowest of the modules 32 has inlet and exit tubes 105 and 106 as previously described in conjunction with FIG. 5. These are fed through respective bores 180 in the next upper sample module 32. Two new exit and entrance tubes 105 and 106 originate from this next module 32. Four tubes are then fed to the next module 32, and so on. Note that each set of entrance and exit tubes 105, 106 for each module is radially angularly displaced from the entrance and exit tubes of any other module, such that several such exit and entrance tubes may be threaded up to the probe arm 28 without occlusion by any other entrance or exit tube.

Figure 13:
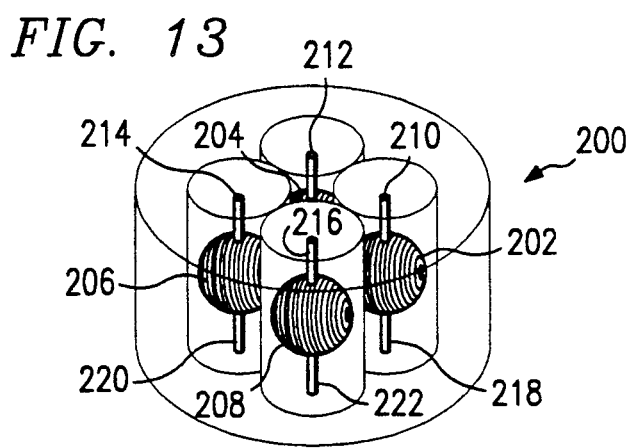
FIG. 13 is an isometric schematic representation of a multiple chamber sample module according to the invention.

Referring now to FIG. 13, an alternative embodiment of a fluid sample module indicated generally at 200 is shown in a schematic perspective view. In the module 200, the single spherical vessel 102 is replaced with a plurality of vessels 202-208 in a radial closest-packing arrangement such that the entirety of all vessels 202-208 will fit within the magnetic field "sweet spot" 144 (FIG. 9). This arrangement may be advantageous where the volume of the required fluid sample is small, but where multiple tests need to be run on several samples. This would allow tests to be run on each of four samples without the manipulation of the probe arm 28 to cause axial displacement of any one module 200 out of the "sweet spot" 144. To save room, a plurality of inlet tubes 210-216 enter the module 200 and respective vessels 202-208 from the top. Corresponding outlet tubes 218-222 (three shown) open onto the interior of the respective spherical vessels 202-208, on the bottom, and exit the axial bore 12 at the bottom. RF detection coils 230 are spirally wrapped around each individual spherical container 202-208 so as to be perpendicular to the static field generated by main coil 14 (FIG. 1).

The NMR clinical chemistry analyzer as above described is capable of quickly and directly detecting and measuring the following:

1) Small molecular weight biochemical analytes, in 100 micromolar or greater concentrations, such as amino acids, small peptides, bioorganic acids, chemotherapeutic drugs, analgesic drugs, certain drug metabolites, urea, and various fatty acids and lipids;

2) The presence of bacterial contamination and gross typing of the contaminating bacteria;

3) Serum fat composition, e.g., chylomicron, LDL, VLDL;

4) Labeled substrates and conversion products, without the need for derivatization;

5) Low level analytes, proteins, drugs and other compounds with paramagnetically tagged antibodies in the ranges of 100 nanomolar to 100 micromolar concentrations;

6) Rates of clearances of drugs and labelled substances for organ function tests, as well as rates of uptake and equilibria conditions;

7) Enzyme activities of certain refractory enzymes without the need for coupled reactions; and 8) Unusual serum properties, such as abnormal protein types or concentrations, proteoglycans, and contamination by heavy metals or fluoride.

The analytes tested by the clinical chemistry analyzer may be derived from blood or its components, such as plasma or serum, as well as urine, cerebrospinal fluid, saliva, and fecal extracts.

In summary, an NMR clinical chemistry analyzer has been disclosed and described having several novel features. A shield has been provided such that all elements of the clinical chemistry analyzer can be contained within one ordinary, nonshielded room, or even one mobile unit. Permanent spherical sample vessels have been described to ease the introduction and removal of the fluid samples from the vessels without reshimming. The NMR magnet is fitted with counter-rotating conductive, nonferromagnetic cylinders to ensure the homogeneity of the magnetic field surrounding the selected fluid sample module. A probe arm assembly has been described whereby several modules may be axially manipulated to bring them within or without the "sweet spot" of the NMR magnetic field. Finally, an alternative fluid sample module has been described containing several spherical vessels such that a plurality of fluid samples may be tested and analyzed simultaneously.

While preferred embodiments of the invention and their advantages have been illustrated in the above detailed description, the invention is not limited to these but only by the scope and spirit of the appended claims.

What is claimed is:

1. A shield constructed so as to be installed around, and to educe the external magnetic field of, a nuclear magnetic resonance magnet, said shield comprising:
axial ends;
a plurality of elongate ferromagnetic bars radially positioned around an axis of said shield such that said bars are in parallel with said axis in the direction of their elongation, the shape of each of said bars curving continuously inwardly from a central plane of said shield midway between said ends toward the axis of said shield, said bars equally spaced from each other; and
a non-ferromagnetic framework joined to said bars and rigidly positioning said bars with respect to said axis and with respect to each other, such that, when said shield is installed around a nuclear magnetic resonance magnet, said shield will reduce the magnetic field emanating from the magnet in a region external to the shield;

said framework comprising a plurality of elongate supports adapted to be joined between attachment points on a rigid jacket of said magnet and respective ones of said bars, each bar having a length and a plurality of attachment points spaced apart from each other along said length, bands of at least two elongate supports attached to each attachment point, opposed ends of the last said supports adaptable to be attached to spaced-apart attachment points on said rigid jacket.

2. The shield of claim 1, wherein the shape of each of said bars is curved to approximately conform to at lest one isomagnetic line of the magnetic field produced by said magnet when said shield is installed around said magnet.

3. The shield of claim 1, wherein each said bar has two opposite ends and a middle between said ends, the thickness of said ends being greater than the thickness of said middle.

4. The shield of claim 1, wherein pairs of said elongate supports form V-shaped trusses in at least a transverse direction with respect to said axis, points of attachment of said elongate supports adaptable to be attached to said rigid jacket displaced transversely angularly from said bars.

5. The shield of claim 1, wherein said framework comprises a plurality of elongate supports formed of aluminum.

6. The shield of claim 1, and further comprising means for adjusting the alignment and position of each of said bars with respect to said magnet in order to obtain an optimum magnetic field homogeneity within said shield.

7. The shield of claim 6, wherein said means for adjusting comprises a plurality of shims for placement between said framework and said bars.

8. The shield of claim 6, wherein said framework includes a plurality of footings adaptable to be mated with respective ones of said attachment points on said bars; and for each footing, a shim selected from a plurality of shims having varying thicknesses, said selected shim inserted between a footing and a corresponding attachment point on said bar such that the radial distance of said bar attachment point to said axis may be varied.

9. A shield nuclear magnetic resonance machine, comprising:

a nuclear magnetic resonance magnet having a length and an axis;

a plurality of elongate ferromagnetic bars each having opposed ends and a middle between said ends, the thickness of said ends being greater than the thickness of said middle, each of said plurality being radially positioned around said axis such that said bars are in parallel with said axis in the direction of their elongation, said bars equally spaced from each other;

a non-ferromagnetic framework joined to said bars and rigidly positioning said bars with respect to said axis and with respect to each other, said bars reducing the strength of the magnetic field generated by said magnet in the region external to said bars; and means for adjusting the alignment and position of said bars with respect to said framework in order to obtain an optimum magnetic field homogeneity within said magnet.

10. The machine of claim 9, wherein said magnet has a rigid jacket and said framework includes a plurality of elongate nonferromagnetic supports, neighboring ones of said bars each transversely angularly displaced from one another, a plurality of axial rows of attachment points on said jacket transversely angularly displaced from said bars, one end of each of said supports joined to a selected attachment point, an opposed end of each of said supports joined to a selected bar.

11. The machine of claim 10, wherein a plurality of said support ends are affixed to each attachment point.

12. The machine of claim 9, wherein each said ferromagnetic bar has opposed ends, a middle in between said ends, and a length, the shape of each of said bar curving inwardly continuously throughout its length such that said middle is perpendicularly radially more removed from said axis than are said ends.

13. The machine of claim 12, wherein the shape of each of said bars is curved to approximately conform to at least one isomagnetic line of the magnetic field produced by said magnet.

14. The machine of claim 9, wherein said magnet includes at least one magnetic field-generating electrical coil, an insulating Dewar vessel disposed around said coil for insulating coolant in order to render said coil superconductive, a rigid jacket of said vessel forming an exterior thereof;

said framework comprising a plurality of elongate supports joined between said jacket and respective ones of said bars, a truss of said elongate supports formed for each said bar.

15. The machine of claim 14, wherein is elongate supports each have a remote end remote from said magnet, said means for adjusting the alignment and position of said bars including, for each bar, a plurality of footings of said framework, said footings corresponding to a plurality of attachment points spaced along the length of each bar, an end of at least two of said elongate supports attached to each footing, said means for adjusting including, for each of said bar attachment points, means for varying the position of an attachment point with respect to a corresponding footing.

16. The machine of claim 15, wherein said means for varying includes means for varying the position of said attachment point of said bar in all directions with respect to said axis.

17. The machine of claim 9, wherein said magnet includes a rigid exterior jacket surrounding a magnetic field generating coil, said framework comprising a plurality of elongate rigid supports affixed between said rigid jacket and said bars, pairs of said elongate supports forming V-shaped trusses in at least a transverse direction with respect to said axis, points of attachment of said elongate supports on said rigid jacket displaced transversely angularly from said bars.

18. The machine of claim 17, and further comprising, for each bar, a plurality of attachment points on said bar, a plurality of ends of said supports joined to each attachment point on said bar.

19. The machine of claim 9, wherein said framework comprises a plurality of elongate supports formed of aluminum.

20. The machine of claim 9, wherein said means for adjusting comprises a plurality of shims for disposal between said framework and said bars.

21. A nuclear magnetic resonance machine, comprising:
a substantially cylindrical magnetic field generating electrical coil having an axis;
a rigid jacket surrounding said coil;
a plurality of elongate ferromagnetic bars disposed around said jacket and aligned with said axis, said bars equally spaced from each other, the shape of each of said bar having opposed ends, a middle and a length, each said bar curving continuously from its middle along its length to its ends such that said middle is more distant from said axis than said ends, the thickness of said ends of each bar being greater than the thickness of said middle of said bar; and
a non-ferromagnetic framework for rigidly positioning said bars in an adjustable relationship with said magnet.

22. The nuclear magnetic resonance machine of claim 21, wherein the equatorial spacing between any one of said bars and said axis being less than about 40 inches, the precision in which said bars are positioned being better or on the order of one part in one thousand.

23. The nuclear magnetic resonance machine of claim 21, wherein said framework comprises a plurality of elongate supports affixed between said jacket and respective ones of said bars, a truss of said elongate supports formed for each said bar.

24. A nuclear magnetic resonance machine, comprising:
a magnetic field generating coil formed around an axis with an axial bore;
a first non-ferromagnetic conductive cylinder axially disposed within said axial bore;
means for rotating said first cylinder about said axis in a first direction;
a second non-ferromagnetic conductive cylinder axially disposed within said first cylinder; and
means for rotating said second cylinder about said axis in a second direction opposite said first direction, such that a predetermined volume within said second cylinder has a substantially uniform magnetic field.

25. The machine of claim 24, wherein said generating coil has a predetermined length in the axial direction, a length of said first and second conductive cylinders being less than said length of said generating coil, said first and second cylinders disposed within said axial bore such that said generating coil will axially overlap said first and second cylinders in either axial direction.

26. The machine of claim 24, wherein said first and second cylinders are formed of copper.

27. The machine of claim 20, wherein said first and second cylinders each have a plurality of elongate open channels formed therein to form current paths therebetween.

28. The machine of claim 27, wherein said first cylinder has a plurality of elongate open channels helically formed in said cylinder in a first spiral direction, said second cylinder having a plurality of elongate open channels helically formed in a second spiral direction, to define helical current paths in said cylinders.

29. The machine of claim 24 wherein said means for rotating said first cylinder about said axis in a first direction comprises a plurality of dielectric fins joined to a selected cylindrical surface of said first cylinder, said means for rotating said second cylinder about said axis in said second direction comprising a plurality of dielectric fins affixed to a selected cylindrical surface of said second cylinder;
said means for rotating further including means for forcing gas in a preselected axial direction to pass said fins on said first and second cylinders, said fins on said first cylinder disposed such that a rotating force in said first direction will be imparted to said first cylinder, said fins on said second cylinder disposed such that a rotating force in said second direction will be imparted to said second cylinder.

30. A method for magnetically shielding a nuclear magnetic resonance magnet having an axis, comprising the steps of:
effecting a nonferromagnetic framework to be affixed to a rigid exterior jacket of said magnet; and
adjustably affixing a plurality of elongate ferromagnetic bars on said framework to be disposed around said magnet and aligned with said axis such that said bars are equally spaced from each other the shape of each of said bars convexly curving inwardly continuously from a center line of the magnet toward an axis thereof, and said step of adjustably affixing including the step of inserting selected ones of a plurality of shims in between said framework and said bars to adjust the radial distance of the bars from the axis.

31. The method of claim 30, wherein the shape of each of said bars curves to conform to at least one preselected isomagnetic line of the magnetic field generated by said magnet.

32. The method of claim 30, wherein each bar is constructed such that the thickness of the bar is less in its middle than its is at its opposed ends.

33. The method of claim 30, and further comprising the step of forming said framework with a plurality of elongate rigid supports joined between said jacket and respective ones of said bars to form a truss of the elongate supports.

34. The method of claim 30, wherein said step of affixing includes the steps of:
physically shimming each bar with respect to a center of a static field generated by said magnet to precisely position each said bar in relation thereto; and
angularly adjusting each said bar in relation to said center.

* * * * *

UNITED STATES PATENT AND TRADEMARK OFFICE
CERTIFICATE OF CORRECTION

PATENT NO. : 5,220,302
DATED : June 15, 1993
INVENTOR(S) : Nunnally et al.

It is certified that error appears in the above-identified patent and that said Letters Patent is hereby corrected as shown below:

Column 8, line 67, after "struts", delete "." and insert --'--.

Column 8, line 68, after "struts", delete "," and insert --'--.

Claim 15, Column 16, line 37, after "wherein" delete "is" and insert --said--.

Claim 27, Column 17, line 55, change "Claim 20" to --Claim 24--.

Signed and Sealed this

Eighth Day of February, 1994

Attest:

BRUCE LEHMAN

Attesting Officer   Commissioner of Patents and Trademarks